(12) United States Patent
Lai

(10) Patent No.: US 8,950,066 B2
(45) Date of Patent: Feb. 10, 2015

(54) METHOD FOR MANUFACTURING LIGHT EMITTING DIODE MODULE

(71) Applicant: ScienBiziP Consulting (Shen Zhen) Co., Ltd., Shenzhen (CN)

(72) Inventor: Chih-Chen Lai, New Taipei (TW)

(73) Assignee: ScienBiziP Consulting (Shenzhen) Co., Ltd., Guangdong (CN)

( * ) Notice: Subject to any disclaimer, the term of this patent is extended or adjusted under 35 U.S.C. 154(b) by 0 days.

(21) Appl. No.: 13/931,454

(22) Filed: Jun. 28, 2013

(65) Prior Publication Data
US 2014/0173885 A1    Jun. 26, 2014

(30) Foreign Application Priority Data
Dec. 24, 2012    (TW) .............................. 101149450 A

(51) Int. Cl.
| H05K 3/30 | (2006.01) |
| H01R 43/00 | (2006.01) |
| H05K 3/00 | (2006.01) |
| F21K 99/00 | (2010.01) |
| G01J 3/00 | (2006.01) |
| G02B 7/02 | (2006.01) |
| F21V 5/04 | (2006.01) |
| F21Y 101/02 | (2006.01) |

(52) U.S. Cl.
CPC *H05K 3/303* (2013.01); *F21K 9/90* (2013.01); *G01J 3/00* (2013.01); *G02B 7/02* (2013.01); *F21V 5/04* (2013.01); *F21Y 2101/02* (2013.01)
USPC .................. 29/832; 29/833; 29/834; 29/825; 29/829

(58) Field of Classification Search
USPC .......................... 29/832, 833, 834, 825, 829
See application file for complete search history.

(56) References Cited

U.S. PATENT DOCUMENTS

| 6,518,600 B1 * | 2/2003 | Shaddock ....................... 257/98 |
| 2005/0224821 A1 * | 10/2005 | Sakano et al. .................. 257/79 |
| 2008/0099727 A1 * | 5/2008 | Sakano et al. ......... 252/301.4 H |
| 2010/0159787 A1 * | 6/2010 | Iijima et al. ..................... 445/25 |
| 2012/0190136 A1 * | 7/2012 | Hong ............................... 438/7 |
| 2013/0178002 A1 * | 7/2013 | Lam et al. ....................... 438/27 |
| 2014/0173885 A1 * | 6/2014 | Lai .................................. 29/593 |

* cited by examiner

*Primary Examiner* — David Angwin
(74) *Attorney, Agent, or Firm* — Novak Druce Connolly Bove + Quigg LLP

(57) ABSTRACT

A method for manufacturing an LED module includes following steps: providing a SMT apparatus having a CCD image sensor, providing a PCB having an LED mounted on, and fixing the PCB in the SMT apparatus; providing a lens, the CCD image sensor imaging the lens, and then the SMT apparatus obtaining a location of the lens relative to the LED, and the SMT apparatus positioning the lens on the PCB to cover the LED; providing an optical diffusing board located above the lens, and electrifying the LED for emitting light towards the optical diffusing board; providing a luminance colorimeter to measure luminance and chroma of light exited from the optical diffusing board, and obtaining a light-emitting data; calculating the light-emitting data, and the SMT apparatus adjusting a position of the lens relative to the LED; and fixing the lens on the PCB.

20 Claims, 6 Drawing Sheets

METHOD FOR MANUFACTURING LIGHT EMITTING DIODE MODULE

BACKGROUND

1. Technical Field

The disclosure generally relates to a method for manufacturing a light emitting diode (LED) module.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A conventional backlight module includes a flat back cover and a plurality of LED modules mounted on the back cover in array. Each of the LED modules should have an illumination angle as large as possible. To achieve this objective, an optical lens is usually required to be placed above the LED. Generally, in a conventional method for manufacturing the LED module, the LEDs are firstly fixed on a substrate by SMT (Surface Mount Technology) apparatus, and then the lens are correspondingly positioned above the LEDs. However, it is hard to position the lens corresponding to the LEDs accurately, it may cause unsuitable light emitting effect of the LED module.

What is needed, therefore, is a method for manufacturing an LED module to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
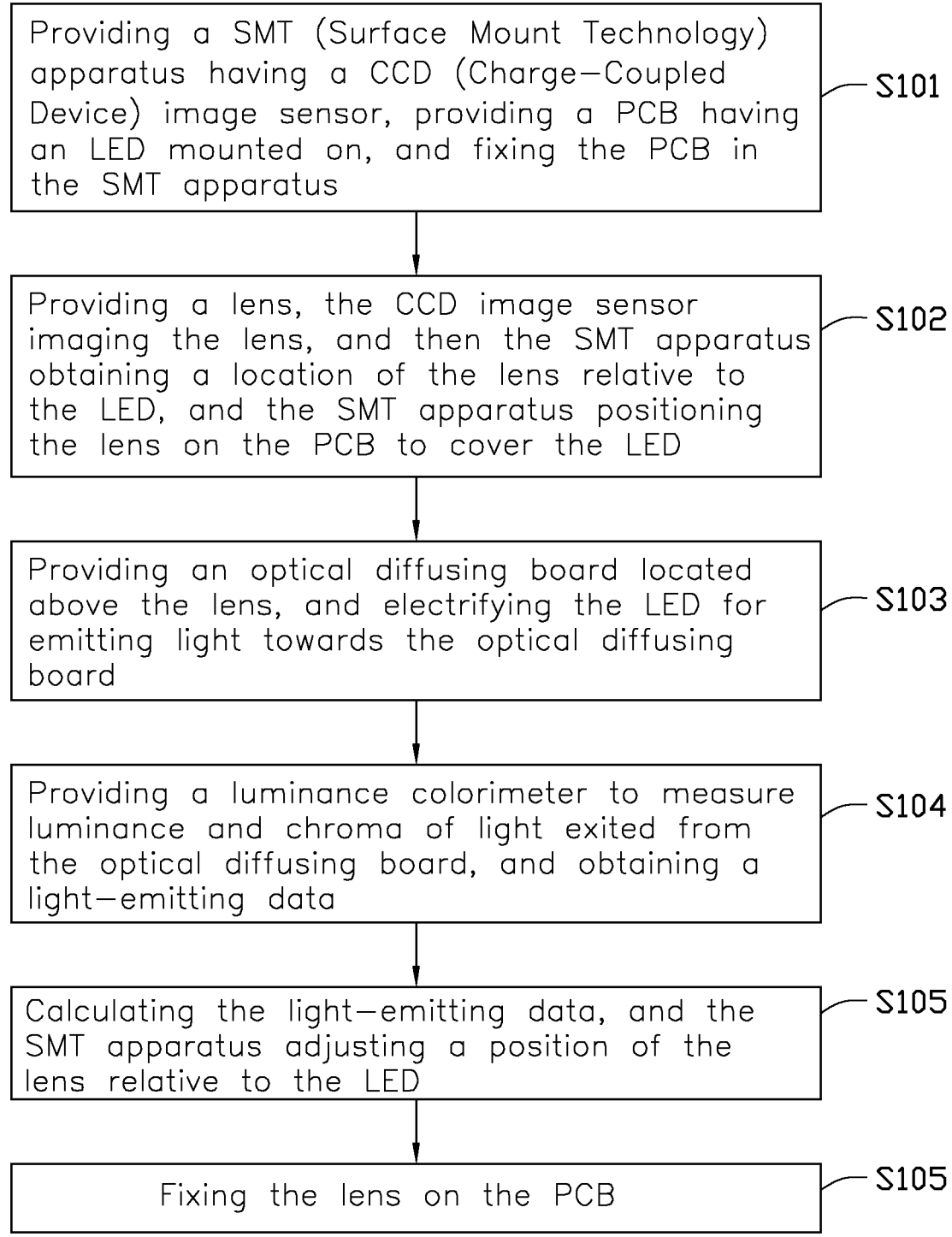
FIG. 1 is a flow chart of a method for manufacturing an LED module in accordance with an embodiment of the present disclosure.
Figure 2:
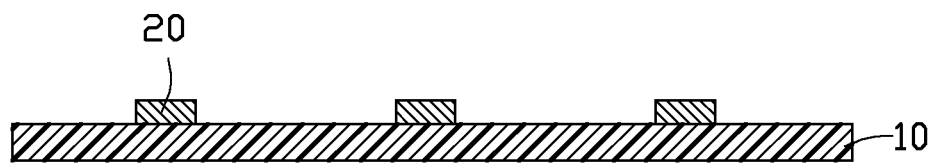
FIG. 2 is a schematic, bottom view of step S101 of the method of FIG. 1.
Figure 3:
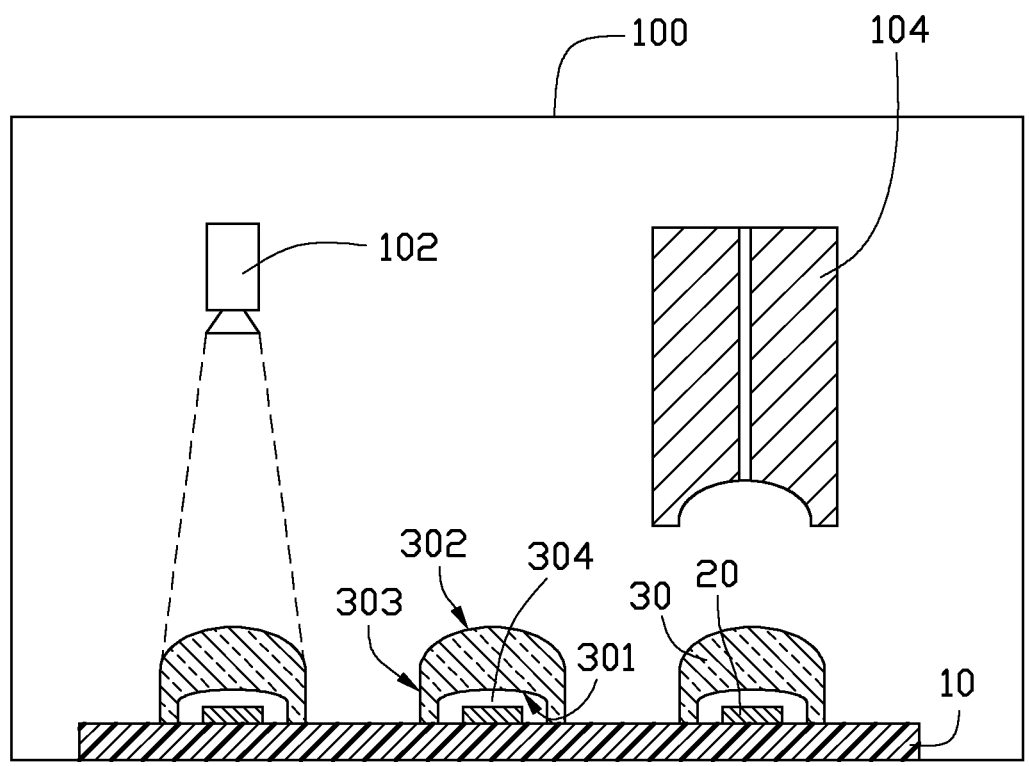
FIG. 3 is a schematic view of step S102 of the method of FIG. 1.
Figure 4:
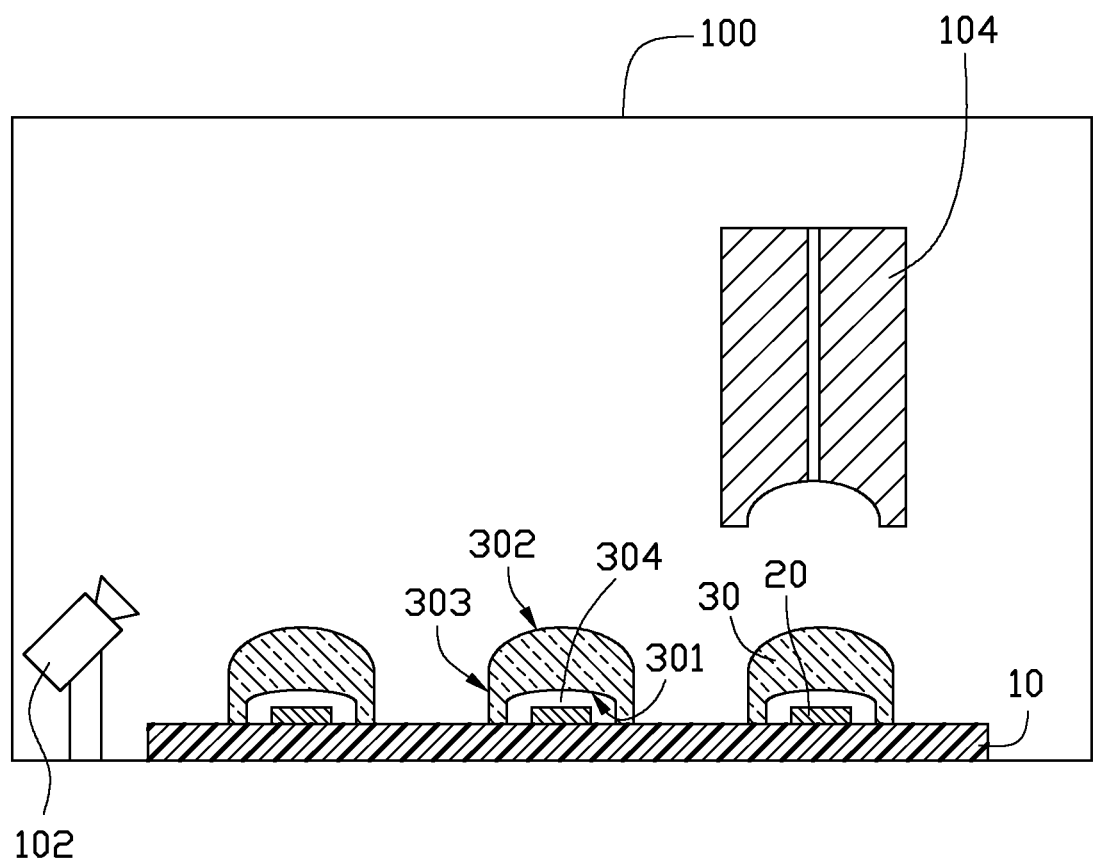
FIG. 4 is an alternative, schematic view of step S102 of the method of FIG. 1.
Figure 5:
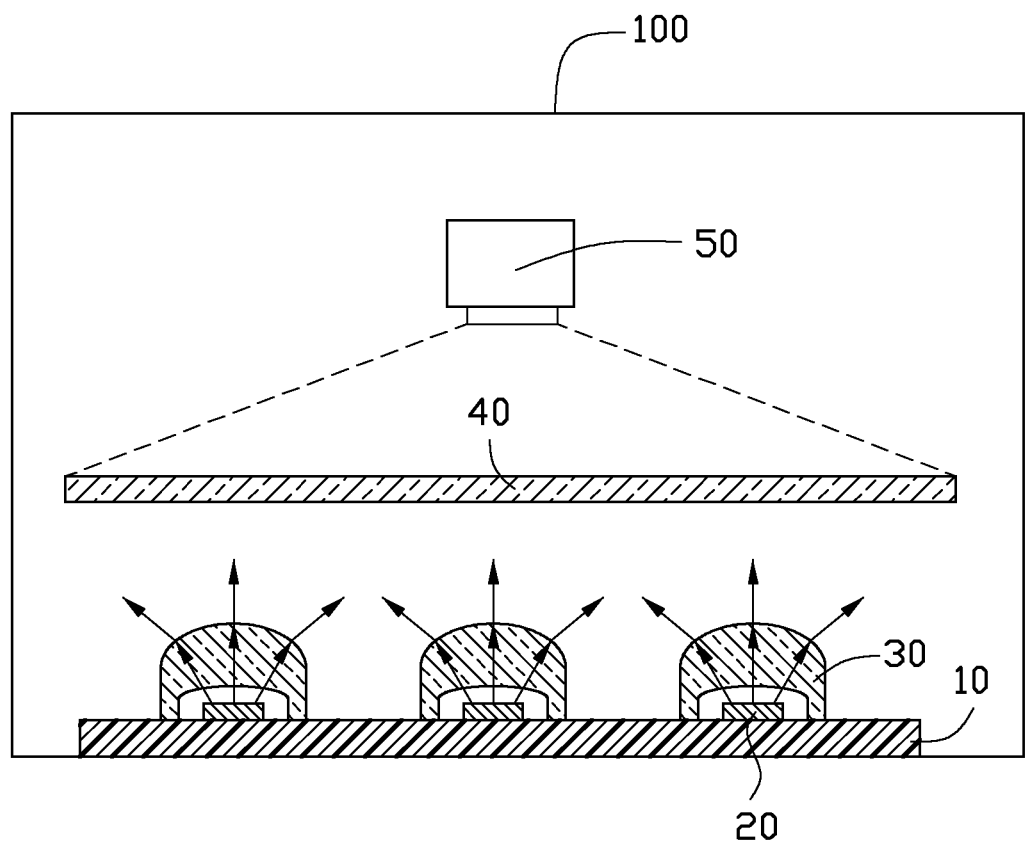
FIG. 5 shows step S103 and step S104 of the method of FIG. 1.

Embodiments of a method for manufacturing a light emitting diode (LED) module will now be described in detail below and with reference to the drawings.

Referring to FIGS. 1-5, a method for manufacturing an LED module in accordance with an embodiment is provided. The method for manufacturing the LED module includes following steps.

Step S101, a SMT (Surface Mount Technology) apparatus 100 is provided, and an elongated PCB 10 having a plurality of LEDs 20 mounted on is positioned in the SMT apparatus 100. The SMT apparatus 100 has a CCD (Charge-Coupled Device) image sensor 102.

Step S102, a plurality of lenses 30 are provided. Each lens 30 is imaged by the CCD image sensor 102, and a location of the lens 30 relative to a corresponding LED 20 is obtained by the SMT apparatus 100, and then the lens 30 is positioned on the PCB 10 and covers the corresponding LED 20 by the SMT apparatus 100.

Step S103, an optical diffusing board 40 is provided. The optical diffusing board 40 is located above the plurality of lenses 30. The LEDs 20 are electrified for emitting light towards the optical diffusing board 40.

Step S104, a luminance colorimeter 50 is provided for measuring luminance and chroma of light exited from the optical diffusing board 40, and a light-emitting data is obtained by the luminance colorimeter 50.

Step S105, the light-emitting data is calculated, and a position of at least a corresponding lens 30 is adjusted by the SMT apparatus 100.

Step S106, each lens 30 is fixed on the PCB 10.

In detail, a manner of positioning the lens 30 on the PCB 10 by the SMT apparatus 100 includes following steps. Firstly, the PCB 10 with the LEDs 20 mounted thereon are transmitted to and fixed in the SMT apparatus 100. Secondly, a corresponding lens 30 is carried by a nozzle 104 of the SMT apparatus 100. Thirdly, referring to FIGS. 3-4 again, an outer periphery or a bottom portion of the lens 30 is imaged by the CCD image sensor 102 to locate the lens 30 relative to a corresponding LED 20 on the PCB 10. Fourthly, a location variation between the lens 30 and the LED 20 is calculated by the SMT apparatus 100. Finally, the lens 30 is positioned on the PCB 10 and covers the corresponding LED 20 by the nozzle 104 of the SMT apparatus 100, according to the location variation.

Each lens 30 is integrally made of transparent materials such as PC (polycarbonate) or PMMA (polymethyl methacrylate). Each lens 30 is horizontally attached on the PCB 10 and correspondingly covers an LED 20. A dimension of the lens 30 is about 3 mm.

Each lens 30 includes a light-incident face 301 facing the LED 20, a light-emitting face 302 opposite to the light-incident face 301, and a connecting face 303 interconnecting the light-incident face 301 and the light-emitting face 302. A center of a bottom portion of the lens 30 is recessed inwardly to form a dome-like receiving room 304 for accommodating the LED 20 therein.

Figure 6:
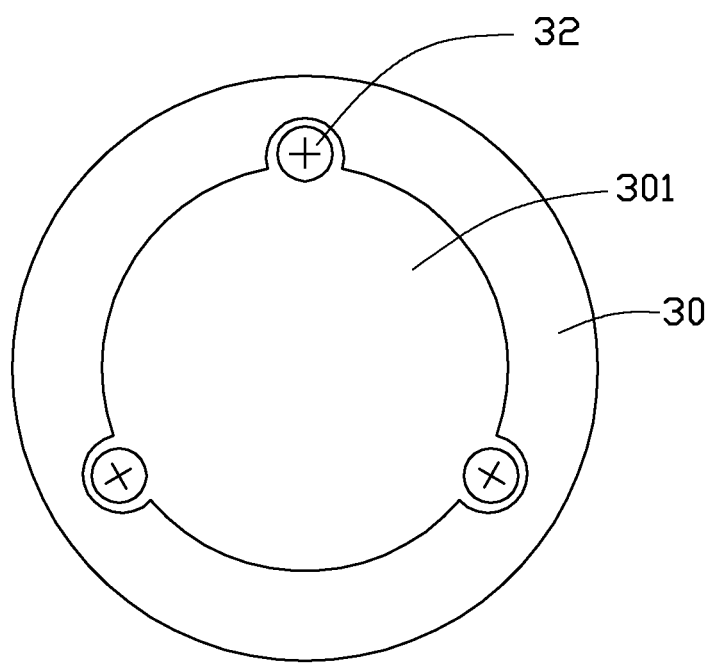
FIG. 6 is a bottom view of a lens of the LED module manufactured by the method of FIG. 1.

Referring to FIG. 6 also, each lens 30 further includes at least a patterned portion 32 configured for being observed in imaging and locating by the SMT apparatus 100. It can be understood that, the patterned portion 32 could be formed on the light-incident face 301, the light-emitting face 302 or the connecting face 303 of the lens 30. In this embodiment of the disclosure, the patterned portion 32 is formed on the light-incident face 301 of the lens 30. A dimension of the patterned portion 32 is about 0.1 mm. In this embodiment of the disclosure, there are three patterned portions 32 evenly spaced from each other.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a light emitting diode (LED) module, comprising following steps:

providing a SMT (Surface Mount Technology) apparatus having a CCD (Charge-Coupled Device) image sensor, providing a PCB having an LED mounted on, and fixing the PCB in the SMT apparatus;
providing a lens, the CCD image sensor imaging the lens, and then the SMT apparatus obtaining a location of the lens relative to the LED, and the SMT apparatus positioning the lens on the PCB to cover the LED;
providing an optical diffusing board located above the lens, and electrifying the LED for emitting light towards the optical diffusing board;
providing a luminance colorimeter to measure luminance and chroma of light exited from the optical diffusing board, and obtaining a light-emitting data;
calculating the light-emitting data, and the SMT apparatus adjusting a position of the lens relative to the LED; and
fixing the lens on the PCB.

2. The method of claim 1, wherein a manner of positioning the lens on the PCB by the SMT apparatus comprises following steps: fixing the PCB with the LED mounted thereon in the SMT apparatus; carrying the lens by a nozzle of the SMT apparatus; the CCD image sensor imaging the lens to locate the lens relative to the LED on the PCB; the SMT apparatus calculating a location variation between the lens and the LED; and the nozzle of the SMT apparatus positioning the lens on the PCB to cover the LED, according to the location variation.

3. The method of claim 2, wherein the CCD image sensor images an outer periphery or a bottom portion of the lens.

4. The method of claim 1, wherein the lens comprises a light-incident face facing the LED, a light-emitting face opposite to the light-incident face, and a connecting face interconnecting the light-incident face and the light-emitting face.

5. The method of claim 4, wherein the lens further comprises a plurality of patterned portions configured for being observed in imaging and locating by the SMT apparatus.

6. The method of claim 5, wherein the patterned portions are formed on the light-incident face.

7. The method of claim 5, wherein the patterned portions are formed on the light-emitting face.

8. The method of claim 5, wherein the patterned portions are formed on the connecting face.

9. The method of claim 5, wherein the patterned portions are evenly spaced from each other.

10. The method of claim 5, wherein a dimension of each patterned portion is 0.1 mm.

11. A method for manufacturing an LED module, comprising following steps:
providing a SMT apparatus having a CCD image sensor, providing a PCB having a plurality of LEDs mounted on, and fixing the PCB in the SMT apparatus;
providing a plurality of lenses, the CCD image sensor imaging the lenses, and then the SMT apparatus obtaining a location of each lens relative to a corresponding LED, and the SMT apparatus correspondingly positioning the lenses on the PCB to cover the LEDs;
providing an optical diffusing board located above the lenses, and electrifying the LEDs for emitting light towards the optical diffusing board;
providing a luminance colorimeter to measure luminance and chroma of light exited from the optical diffusing board, and obtaining a light-emitting data;
calculating the light-emitting data, and the SMT apparatus correspondingly adjusting positions of the lenses relative to the LEDs; and
fixing the lenses on the PCB.

12. The method of claim 11, wherein a manner of positioning each of the lens on the PCB by the SMT apparatus comprises following steps: fixing the PCB with the LED mounted thereon in the SMT apparatus; carrying the lens by a nozzle of the SMT apparatus; the CCD image sensor imaging the lens to locate the lens relative to the corresponding LED on the PCB; the SMT apparatus calculating a location variation between the lens and the corresponding LED; and the nozzle of the SMT apparatus positioning the lens on the PCB to cover the corresponding LED, according to the location variation.

13. The method of claim 12, wherein the CCD image sensor images an outer periphery or a bottom portion of the lens.

14. The method of claim 11, wherein the lens comprises a light-incident face facing the corresponding LED, a light-emitting face opposite to the light-incident face, and a connecting face interconnecting the light-incident face and the light-emitting face.

15. The method of claim 14, wherein the lens further comprises a plurality of patterned portions configured for being observed in imaging and locating by the SMT apparatus.

16. The method of claim 15, wherein the patterned portions are formed on the light-incident face.

17. The method of claim 15, wherein the patterned portions are formed on the light-emitting face.

18. The method of claim 15, wherein the patterned portions are formed on the connecting face.

19. The method of claim 15, wherein the patterned portions are evenly spaced from each other.

20. The method of claim 15, wherein a dimension of each patterned portion is 0.1 mm.

* * * * *